United States Patent
Wang (10) Patent No.: US 12,099,780 B2
(45) Date of Patent: Sep. 24, 2024

(54) METHOD AND MANUFACTURING METHOD OF MULTI-LINKAGE PLANETARY GEAR SPEED CHANGING MECHANISM, AND MULTI-LINKAGE PLANETARY GEAR SPEED CHANGING MECHANISM

(71) Applicant: Guofu Wang, Huili (CN)

(72) Inventor: Guofu Wang, Huili (CN)

(*) Notice: Subject to any disclaimer, the term of this patent is extended or adjusted under 35 U.S.C. 154(b) by 0 days.

(21) Appl. No.: 18/637,233

(22) Filed: Apr. 16, 2024

(65) Prior Publication Data

US 2024/0289512 A1 Aug. 29, 2024

Related U.S. Application Data

(63) Continuation of application No. PCT/CN2021/137748, filed on Dec. 14, 2021.

(30) Foreign Application Priority Data

Dec. 14, 2021 (CN) .......................... 202111524572.6

(51) Int. Cl.
F16H 57/08 (2006.01)
G06F 30/17 (2020.01)
F16H 57/00 (2012.01)

(52) U.S. Cl.
CPC ............ *G06F 30/17* (2020.01); *F16H 57/08* (2013.01); *F16H 2057/0087* (2013.01)

(58) Field of Classification Search
CPC .. G06F 30/17; F16H 57/08; F16H 2057/0087; F16H 57/082
See application file for complete search history.

(56) References Cited

U.S. PATENT DOCUMENTS 9,994,098 B2 * 6/2018 Ai ........................... B60K 6/387
2018/0003283 A1 * 1/2018 James ..................... G06F 30/17

FOREIGN PATENT DOCUMENTS

| CN | 101216090 A | 7/2008 |
| CN | 101228367 A | 7/2008 |
| CN | 206802206 U | 12/2017 |
| CN | 109190214 A | 1/2019 |
| CN | 109312823 A | 2/2019 |

(Continued)

OTHER PUBLICATIONS

Internation Search Report of PCT/CN2021/137748, Mailed Sep. 14, 2022.

(Continued)

*Primary Examiner* — Ryan J. Walters (57) ABSTRACT

The invention relates to a design method and a manufacturing method of a multi-linkage planetary gear speed changing mechanism and a gear speed changing mechanism, a planetary gear set is designed in a specific calculation mode in combination with different processing and assembling modes, by positioning and assembling the planetary gear set, the limitation of assembly condition of the multi-linkage planetary gear speed changing mechanism is broken through, and the assembled and manufactured multi-linkage planetary gear speed changing mechanism can obtain different speed ratios according to different transmission requirements, so that an application of the multi-linkage planetary gear speed changing mechanism is expanded.

8 Claims, 4 Drawing Sheets

(56) References Cited

FOREIGN PATENT DOCUMENTS

| CN | 111814259 A | 10/2020 |
|---|---|---|
| JP | 2008275112 A | 11/2008 |
| KR | 20020080209 A | 10/2002 |

OTHER PUBLICATIONS

Haiming Zhao et al., "Study on the Tooth Marching Method of RV Reducer Based on Assembly Condition", Journal of Mechanical Transmission, No. 12, Dec. 15, 2014.

Wen Wang et al., "Research on the Theory of the Random Assembly of Compound Planet Gear Train and the Analysis of the Minimum Gear Assembly Backlash", Modern Manufacturing Engineering, No. 5, Mar. 31, 2015, p. 98-101.

Peiyong Chen et al., "Efficient Tooth Matching Method for Double Helical Planetary Gears", Automobil Industrie, No. 4, Feb. 23, 2020.

Hong, Lei et al., "Design of the Multi-Stage Planetary Gear Transmission", Journal of Mechanical Transmission, vol. 35, No. 06, Jun. 30, 2011, pp. 52-55.

Hu, Qingchun et al., "Multi-Objective Optimal Design Study of the Two-Stage Planetary Geared Systems Based on the MATLAB", Modern Manufacturing Engineering, No. 03, Mar. 18, 2008, pp. 98-101.

\* cited by examiner

METHOD AND MANUFACTURING METHOD OF MULTI-LINKAGE PLANETARY GEAR SPEED CHANGING MECHANISM, AND MULTI-LINKAGE PLANETARY GEAR SPEED CHANGING MECHANISM

CROSS-REFERENCE TO RELATED APPLICATIONS

This application is a continuation of International Patent Application No. PCT/CN2021/137748 with a filing date of Dec. 14, 2021, designating the United States, now pending, and further claims priority to Chinese Patent Application No. 202111524572.6 with a filing date of Dec. 14, 2021. The content of the aforementioned applications, including any intervening amendments thereto, are incorporated herein by reference.

TECHNICAL FIELD

The present invention relates to the technical field of mechanical engineering, and particularly to a design method and manufacturing method of a multi-linkage planetary gear speed changing mechanism, and a gear speed changing mechanism.

BACKGROUND OF THE PRESENT INVENTION

Planetary gear speed change is an important part of a speed change method in the technical field of mechanical engineering, and due to the advantages of small mass, small volume, large bearing capacity and high transmission efficiency, etc., planetary gear speed change transmission is widely applied in various mechanical devices. In order to meet use requirements, planetary gear mechanisms such as Ravigneaux and Simpson have been developed on the basis of planetary gear transmission mechanisms such as NGW, NN, NW, WW and NGWN, and when these mechanisms are designed, four conditions of transmission ratio, adjacency, concentricity and assembly must be met. For the NGW planetary gear speed changing mechanism, the conditions can be met by adjusting a number of teeth of a lower planetary gear $Z_g$, a number of teeth of a sun gear $Z_a$ and a number of teeth of a ring gear $Z_b$ at will, but speed ratios of the NGW planetary gear speed changing mechanisms are all below 10 due to the limitation of physical size and economic requirements. For other types of multi-linkage planetary gear speed changing mechanisms, many required speed ratios cannot be designed due to the limitation of design condition of assembly condition $$\left(\frac{n(Z_aZ_f \pm Z_gZ_b)}{Z_gnp} = \text{integer}\right)$$

and many design variable relationships, thus limiting the practicability. Moreover, this assembly condition can only be used in a two-linkage planetary gear speed changing mechanism, which is more difficult to be used in a design with many gears and a linear change of gear ratio, such as a speed change of an automobile, and meanwhile, the transmission design becomes more complicated, which increases a manufacturing cost and a maintenance difficulty.

In order to manufacture a multi-linkage planetary gear speed changing mechanism that does not meet the condition $$\left(\frac{n(Z_aZ_f \pm Z_gZ_b)}{Z_gnp} = \text{integer}\right),$$

in existing methods, two sets of planetary gears, sun gears and ring gears designed according to the transmission principle of the NGW planetary gear speed changing mechanism are assembled, and then the two sets of planetary gears are fixedly connected into a whole to realize the use of the two-linkage planetary gear speed changing mechanism, which realizes tooth alignment by assembly. However, because the sun gears, the planetary gears and the ring gears all have an inevitable meshing gap between teeth, there is a very serious meshing error in assembly without accurate calculation and positioning, so that the multi-linkage planetary gear speed changing mechanism is almost impossible to use, and this method cannot be used in a planetary gear speed changing mechanism of more linkages. Moreover, in order to meet speed ratio requirements, there is also a method for manufacturing the multi-linkage planetary gear speed changing mechanism that does not meet the condition $$\left(\frac{n(Z_aZ_f \pm Z_gZ_b)}{Z_gnp} = \text{integer}\right)$$

by addendum modification of the planetary gears, the sun gears and the ring gears, which is typical as the patent "201780034752.1" applied by Yokohama National University of Japanese National University. However, such design has many variable relationships and complicated calculation, and because a modification coefficient cannot be too large, a designable range of gear ratio is limited, it is very difficult to design the two-linkage planetary gear speed changing mechanism with the limitation of gear ratio, and it is even more impossible to design the multi-linkage planetary gear speed changing mechanism with a wider range of gear ratio.

SUMMARY OF THE PRESENT INVENTION

Aiming at the defects in the prior art, the present invention provides a design method and manufacturing method of a multi-linkage planetary gear speed changing mechanism, and a gear speed changing mechanism, tooth alignment of a planetary gear set is designed in a specific calculation mode, by positioning and assembling the planetary gear set in combination with different processing and assembling modes, the limitation of assembly condition of a multi-linkage planetary gear speed changing mechanism is broken through, and the assembled and manufactured multi-linkage planetary gear speed changing mechanism can obtain different speed ratios according to different transmission requirements, so that an application of the multi-linkage planetary gear speed changing mechanism is expanded.

In order to achieve the above object, firstly, the present invention provides a design method of a gear speed changing mechanism, used for designing a multi-linkage planetary gear speed changing mechanism, where a plurality of coaxial planetary gears in the multi-linkage planetary gear speed changing mechanism form one set, a tooth aligning mechanism and a plurality of planetary gears on the same radial plane form one linkage, and the design method includes the following steps of:

1. taking any planetary gear set as a first planetary gear set, and subjecting the planetary gear set to tooth alignment with the tooth aligning mechanism to determine a relative tooth aligning position of the first planetary gear set; and setting a baseline position of each planetary gear set as a 0° line position, and making one tooth valley center of a planetary gear of each linkage in the first planetary gear set correspond to the baseline position;

2. determining the baseline position of each planetary gear set as a tooth aligning position of each planetary gear set, and calculating a tooth difference angle position of a planetary gear of each linkage in each planetary gear set relative to the baseline position; and 3. taking the relative tooth aligning position of the first planetary gear set as a calculation starting position, and sequentially calculating a relative tooth aligning position of each planetary gear set according to a set sequence.

Further, when the relative tooth aligning position of the first planetary gear set is determined, there are two cases as follows:

in a first case, the tooth aligning mechanism is set as a ring gear, one tooth peak center of the ring gear is taken as a 0° line position of the ring gear, and the 0° line position of the ring gear is determined as the relative tooth aligning position of the first planetary gear set on the ring gear; and in a second case, the tooth aligning mechanism is set as a sun gear, one tooth peak center of the sun gear is taken as a 0° line position of the sun gear, and the 0° line position of the sun gear is determined as the relative tooth aligning position of the first planetary gear set on the sun gear during tooth alignment with the sun gear.

Further, when the tooth difference angle position is calculated, there are two specific calculation modes as follows:

in a first calculation mode, the multi-linkage planetary gear speed changing mechanism has a total of N linkages, the planetary gear of each linkage in each planetary gear set as gn, n is a linkage sequence of the planetary gear of each linkage, n=1, 2, 3 . . . N, a ring gear of each linkage is by, y is a linkage sequence of the ring gear of each linkage, y=1, 2, 3 . . . N, the tooth difference angle position of the planetary gear of each linkage in each planetary gear set relative to the baseline position is calculated according to a calculation formula of $$360° - \left[\frac{\frac{360°(m-1)}{M}}{\frac{360°}{z_{by}}} - \text{integer number of teeth}\right]\frac{360°}{Z_{gn}},$$

where M is a number of planetary gear sets, m is a set sequence of each planetary gear set arranged clockwise, m=1, 2, 3 . . . M, $Z_{gn}$ is a number of teeth of the planetary gear of each linkage in the multi-linkage planetary gear speed changing mechanism, $Z_{by}$ is a number of teeth of the ring gear in the same linkage with the planetary gear, the integer number of teeth is an integer in $$\frac{\frac{360°(m-1)}{M}}{\frac{360°}{z_{by}}},$$

and $$\left[\frac{\frac{360°(m-1)}{M}}{\frac{360°}{z_{by}}} - \text{integer number of teeth}\right]\frac{360°}{Z_{gn}}$$

is a tooth difference angle of the planetary gear of each linkage in each planetary gear set relative to the baseline position; and in a second calculation mode, the multi-linkage planetary gear speed changing mechanism has a total of N linkages, the planetary gear of each linkage in each planetary gear set as gn, n is a linkage sequence of the planetary gear of each linkage, n=1, 2, 3 . . . N, a sun gear of each linkage is ax, x is a linkage sequence of the sun gear of each linkage, x=1, 2, 3 . . . N, the tooth difference angle position of the planetary gear of each linkage in each planetary gear set relative to the baseline position is calculated according to a calculation formula of $$360° - \left[\frac{\frac{360°(m-1)}{M}}{\frac{360°}{z_{ax}}} - \text{integer number of teeth}\right]\frac{360°}{Z_{gn}},$$

where M is a number of planetary gear sets, m is a set sequence of each planetary gear set arranged counterclockwise, m=1, 2, 3 . . . M, $Z_{gn}$ is a number of teeth of the planetary gear of each linkage in the multi-linkage planetary gear speed changing mechanism, $Z_{ax}$ is a number of teeth of the sun gear in the same linkage with the planetary gear, the integer number of teeth is an integer in $$\frac{\frac{360°(m-1)}{M}}{\frac{360°}{z_{ax}}},$$

and $$\left[\frac{\frac{360°(m-1)}{M}}{\frac{360°}{z_{ax}}} - \text{integer number of teeth}\right]\frac{360°}{Z_{gn}}$$

is a tooth difference angle of the planetary gear of each linkage in each planetary gear set relative to the baseline position.

Further, the present invention further provides a manufacturing method of a gear speed changing mechanism, which includes the following steps of:

1. designing a multi-linkage planetary gear speed changing mechanism by the design method above, and processing and assembling each planetary gear set according to a baseline position and a tooth difference angle position; and 2. sequentially subjecting each planetary gear set to tooth alignment assembly with a tooth aligning mechanism on a planetary carrier according to a set sequence.

During specific manufacturing, there are two methods as follows:

in a first method, the baseline position of the planetary gear set is determined first, then a tooth difference angle position of a planetary gear of each linkage is determined according to the baseline position, and finally, the planetary gear set is processed and assembled by taking the tooth difference angle position of the planetary gear of each linkage as a gear tooth processing starting position of the planetary gear of each linkage; and in a second method, the planetary gear of each linkage in the planetary gear set is respectively processed and molded first, then a baseline position of the planetary gear of each linkage is determined according to the tooth difference angle position of the planetary gear of each linkage by taking one tooth valley center of the planetary gear of each linkage as a starting point, and the planetary gear of each linkage in the planetary gear set is assembled into the set according to the determined baseline position.

Further, the present invention further provides a gear speed changing mechanism manufactured by the manufacturing method above.

Compared with the prior art, the present invention has the following beneficial effects.

1. According to the present invention, by designing and calculating the baseline position, the tooth aligning position, the relative tooth aligning position and the tooth difference angle position, tooth alignment of one planetary gear set in the multi-linkage planetary gear speed changing mechanism is determined first, then the rest planetary gear sets are designed and calculated by a specific calculation mode, and the planetary gear sets are processed and assembled in combination with different processing and assembly modes, so that all finally, manufactured planetary gear sets can realize rapid tooth alignment by positioning and assembly, thus breaking through the limitation of assembly condition of the multi-linkage planetary gear speed changing mechanism, and expanding an application of the multi-linkage planetary gear speed changing mechanism.

2. According to the multi-linkage planetary gear speed changing mechanism designed by the design method in the present invention, a number of linkages, and the ring gear and the sun gear required for forming transmission may be selected according to actual transmission requirements, so that different speed ratios may be obtained by adopting different input, output and fixation relationships, thus being more convenient in a design with a large speed ratio or a design with many gears and a linear change of gear ratio, such as a speed change of an automobile, and reducing a manufacturing cost and a maintenance difficulty at the same time.

DETAILED DESCRIPTION OF PREFERRED EMBODIMENTS

The technical solution of the present invention is further described hereinafter with reference to the drawings.

First Embodiment

Figure 1:
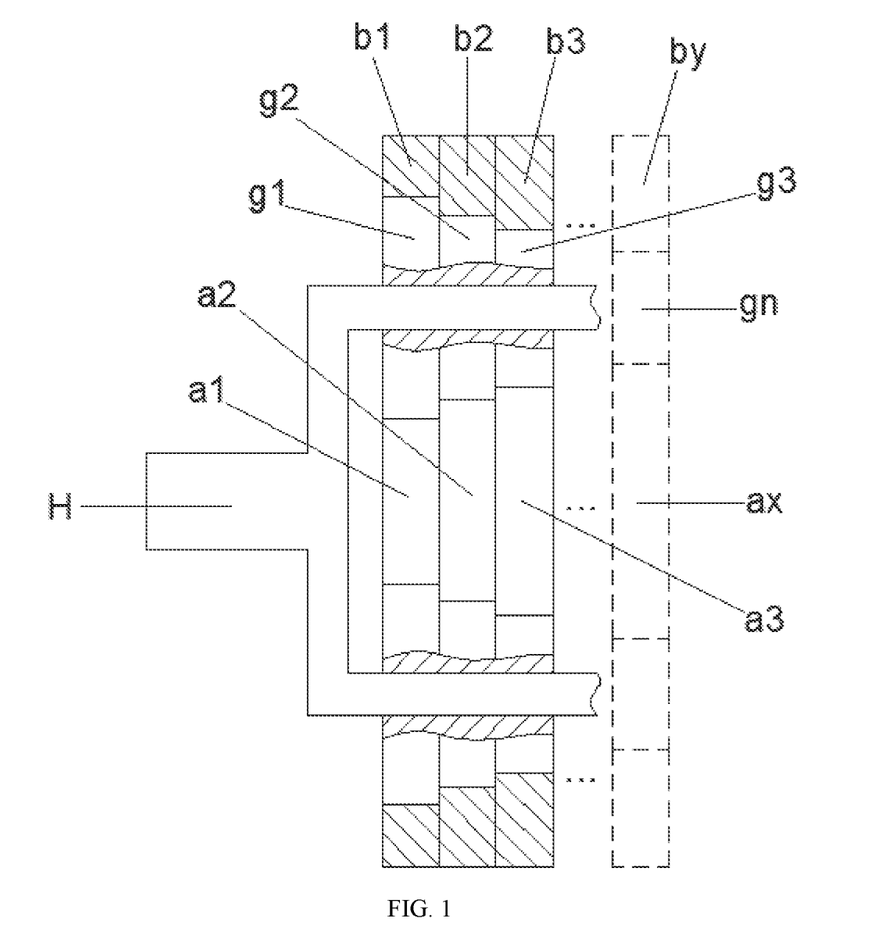
FIG. 1 is a schematic structural diagram of a principle of a multi-linkage planetary gear speed changing mechanism.

For a multi-linkage planetary gear speed changing mechanism shown in FIG. 1, a plurality of coaxial planetary gears g are taken as one set, and a tooth aligning mechanism and the plurality of planetary gears g on the same radial plane are taken as one linkage, where the tooth aligning mechanism is a ring gear b or a sun gear a. Each planetary gear set is subjected to tooth alignment with the tooth aligning mechanism on a planetary carrier H, the multi-linkage planetary gear speed changing mechanism is set to have a total of N linkages, a planetary gear of each linkage in each planetary gear set as gn, n is a linkage sequence of the planetary gear of each linkage, n=1, 2, 3 . . . N, a ring gear of each linkage is by, y is a linkage sequence of the ring gear of each linkage, y=1, 2, 3 . . . N, and a sun gear of each linkage is ax, x is a linkage sequence of the sun gear of each linkage, x=1, 2, 3 . . . N.

When the multi-linkage planetary gear speed changing mechanism in FIG. 1 is designed according to a design principle of an NGW planetary gear mechanism, the sun gear, the ring gear and the planetary gears of the same linkage may be integrally regarded as one NGW planetary gear mechanism, which means that each linkage of the multi-linkage planetary gear speed changing mechanism meets a concentricity condition, an adjacency condition and an assembly condition of the NGW planetary gear mechanism. Then, in combination with a meshing transmission principle of the NGW planetary gear mechanism, when a number of teeth of each planetary gear in the planetary gear set is reduced progressively, a number of teeth of each ring gear is reduced progressively, and a number of teeth of each sun gear is increased progressively. When the number of teeth of the planetary gear of each linkage in the same set is set to be $Z_{gn}$, $Z_{g1}-Z_{gn}=\Delta gn$, when the number of teeth of the ring gear of each linkage is set to be $Z_{by}$, $Z_{b1}-Z_{by}=\Delta by$, and when the number of teeth of the sun gear of each linkage is set to be $Z_{ax}$, $Z_{ax}-Z_{a1}=\Delta ax$, so that $\Delta gn=\Delta by=\Delta ax$. Therefore, a number of planetary gear sets may be set to be M according to actual requirements first, and then a $1^{st}$ linkage is taken as a reference linkage to serve as a design basis, so as to calculate $Z_{g1}$, $Z_{a1}$ and $Z_{b1}$. Then, the number of teeth of the planetary gear of each linkage $Z_{gn}$ is set according requirements, and finally, $Z_{by}$ and $Z_{ax}$ of each corresponding linkage are calculated according to $\Delta gn=\Delta by=\Delta ax$.

In order to solve the problem that the multi-linkage planetary gear speed changing mechanism above is complicated, difficult and greatly limited in actual tooth alignment assembly, this embodiment provides a design method of a gear speed changing mechanism as follows for designing the multi-linkage planetary gear speed changing mechanism, and the design method mainly includes the following steps of:

1. taking any planetary gear set as a first planetary gear set, and subjecting the planetary gear set to tooth alignment with the tooth aligning mechanism to determine a relative tooth aligning position of the first planetary gear set; and setting a baseline position of each planetary gear set as a 0° line position, and making one tooth valley center of a planetary gear of each linkage in the first planetary gear set correspond to the baseline position;
2. determining the baseline position of each planetary gear set as a tooth aligning position of each planetary gear set, and calculating a tooth difference angle position of a planetary gear of each linkage in each planetary gear set relative to the baseline position; and
3. taking the relative tooth aligning position of the first planetary gear set as a calculation starting position, and calculating a relative tooth aligning position of each planetary gear set.

Figure 3:
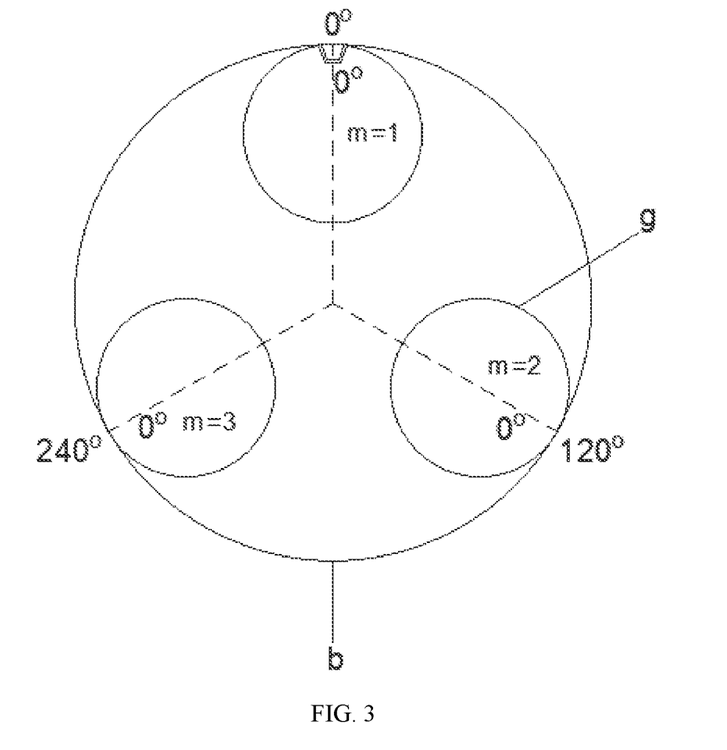
FIG. 3 is a schematic diagram of a corresponding relationship between each planetary gear set and a ring gear in the case of tooth alignment with the ring gear in the present invention.

Specifically, the tooth aligning mechanism is set as the ring gear first, and the tooth aligning position of the planetary gear set is determined as the baseline position of the planetary gear set, which means that when the planetary gear set is subjected to tooth alignment assembly, the planetary gear of each linkage in the planetary gear set is subjected to tooth alignment with the corresponding ring gear by taking the baseline position as its own tooth aligning position. As shown in FIG. 3, according to the distribution of planetary gear sets in the NGW planetary gear mechanism, each planetary gear set is subjected to tooth alignment with the ring gear at a line position $$\frac{360°(m-1)}{M}$$

on the corresponding ring gear clockwise, where M is the number of planetary gear sets, m is the set sequence of each planetary gear set arranged clockwise, and m=1, 2, 3 . . . M. The tooth aligning position of each planetary gear set on the ring gear is defined as the relative tooth aligning position of each planetary gear set herein.

Figure 2:
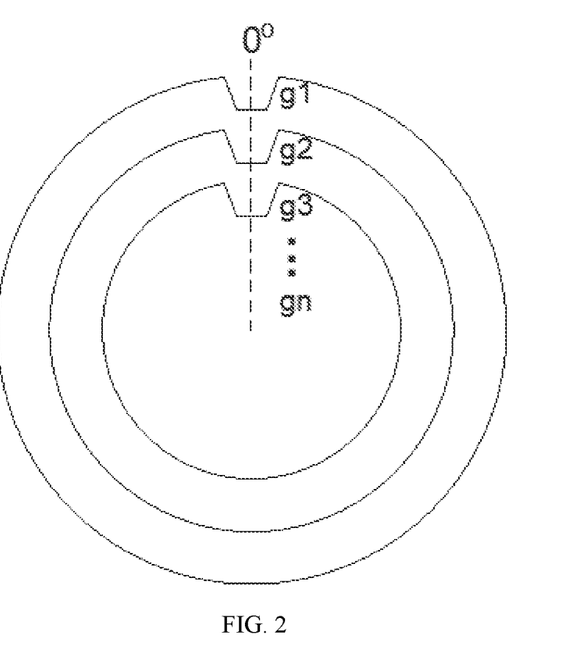
FIG. 2 is a diagram showing a corresponding relationship between each planetary gear in a first planetary gear set and a baseline position in the present invention.

As shown in FIG. 2 and FIG. 3, one tooth peak center of the ring gear is taken as a 0° line position of the ring gear, and the 0° line position of the ring gear is determined as the relative tooth aligning position of the first planetary gear set on the ring gear. The baseline position of each planetary gear set is set as the 0° line position, so that one tooth valley center of the planetary gear of each linkage in the first planetary gear set corresponds to the baseline position.

Because the tooth aligning position and the relative tooth aligning position of the first planetary gear set have been determined, according to an operation principle of the NGW planetary gear mechanism, the planetary gear of each linkage in the rest planetary gear sets may be regarded as the planetary gear of each linkage in the first planetary gear set moving from the 0° line position of the ring gear to the corresponding line position $$\frac{360°(m-1)}{M}.$$

Because all teeth of a gear are evenly distributed around a circumference to belong to a closed loop, it is necessary to find a gear tooth processing starting point when the planetary gear of each linkage is processed, and it has been determined that one tooth valley center of the planetary gear of each linkage in the first planetary gear set corresponds to the baseline position, so that for the first planetary gear set, the determined tooth valley center of the planetary gear of each linkage may be directly taken as the gear tooth processing starting point, and for the planetary gear of each linkage in the rest planetary gear sets, the tooth valley center closest to the baseline position in a clockwise direction is taken as the gear tooth processing starting point. Therefore, it is necessary to calculate an angle between the tooth valley center closest to the baseline position and the baseline position, so as to find a specific position of the gear tooth processing starting point based on the baseline position, and the calculated angle is defined as the tooth difference angle of the planetary gear of each linkage in the planetary gear set herein.

For the calculation of the tooth difference angle, according to the operation principle of the NGW planetary gear mechanism, when the planetary gear of each linkage in the first planetary gear set moves from the 0° line position of the ring gear to the corresponding line position $$\frac{360°(m-1)}{M},$$

a number of rotated teeth of the planetary gear of each linkage is equal to a number of teeth of the corresponding ring gear of each linkage from the 0° line position to the line position $$\frac{360°(m-1)}{M},$$

and a degree of each tooth in each ring gear of each linkage is $360°/z_{by}$, so that the number of rotated teeth of the planetary gear of each linkage in the same linkage with the ring gear of each linkage is $$\frac{\frac{360°(m-1)}{M}}{\frac{360°}{z_{by}}},$$

and the angle between the tooth valley center closest to the baseline position and the baseline position is less than a degree of one gear tooth. Therefore, an integer in $$\frac{\frac{360°(m-1)}{M}}{\frac{360°}{z_{by}}}$$

is subtracted, and then, according to the degree of the gear tooth of each linkage $360°/z_{gn}$, the tooth difference angle of the planetary gear of each linkage in each planetary gear set $$\left[\frac{\frac{360°(m-1)}{M}}{\frac{360°}{z_{by}}} - \text{integer number of teeth}\right]\frac{360°}{z_{gn}}$$

is obtained.

The baseline position of each planetary gear set has been set as the 0° line position above, and the 0° line position on the planetary gear set is also a 360° line position, so that, according to the tooth difference angle, a position of the tooth valley center of the planetary gear of each linkage in each planetary gear set closest to the baseline position relative to the baseline position at the line position $$\frac{360°(m-1)}{M}$$

of the corresponding ring gear is $$360° - \left[\frac{\frac{360°(m-1)}{M}}{\frac{360°}{z_{by}}} - \text{integer number of teeth}\right]\frac{360°}{Z_{gn}},$$

where $Z_{gn}$ is the number of teeth of the planetary gear of each linkage in the multi-linkage planetary gear speed changing mechanism, $Z_{by}$ is the number of teeth of the ring gear in the same linkage with the planetary gear, and an integer number of teeth is the integer in $$\frac{\frac{360°(m-1)}{M}}{\frac{360°}{z_{by}}}.$$

The calculated position of the tooth valley center is defined as the tooth difference angle position of the planetary gear of each linkage in each planetary gear set.

Preferably, for the convenience of calculation and understanding, as shown in FIG. 3, taking a case that the number of planetary gear sets is 3 and each planetary gear set is composed of 3 coaxially connected planetary gears as an example, the tooth difference angle position of the planetary gear of each linkage in each planetary gear set relative to the baseline position is as follows.

A tooth difference angle position of a planetary gear of each linkage in a first planetary gear set is respectively the 0° line position.

A tooth difference angle position of a planetary gear of a first linkage in a second planetary gear set is a line position $$360° - \left[\frac{\frac{360°(2-1)}{3}}{\frac{360°}{z_{b1}}} - \text{integer number of teeth}\right]\frac{360°}{Z_{g1}}.$$

A tooth difference angle position of a planetary gear of a second linkage in the second planetary gear set is a line position $$360° - \left[\frac{\frac{360°(2-1)}{3}}{\frac{360°}{z_{b2}}} - \text{integer number of teeth}\right]\frac{360°}{Z_{g2}}.$$

A tooth difference angle position of a planetary gear of a third linkage in the second planetary gear set is a line position $$360° - \left[\frac{\frac{360°(2-1)}{3}}{\frac{360°}{z_{b3}}} - \text{integer number of teeth}\right]\frac{360°}{Z_{g3}}.$$

A tooth difference angle position of a planetary gear of a first linkage in a third planetary gear set is a line position $$360° - \left[\frac{\frac{360°(3-1)}{3}}{\frac{360°}{z_{b1}}} - \text{integer number of teeth}\right]\frac{360°}{Z_{g1}}.$$

A tooth difference angle position of a planetary gear of a second linkage in the third planetary gear set is a line position $$360° - \left[\frac{\frac{360°(3-1)}{3}}{\frac{360°}{z_{b2}}} - \text{integer number of teeth}\right]\frac{360°}{Z_{g2}}.$$

A tooth difference angle position of a planetary gear of a third linkage in the third path planetary gear set is a line position $$360° - \left[\frac{\frac{360°(3-1)}{3}}{\frac{360°}{z_{b3}}} - \text{integer number of teeth}\right]\frac{360°}{Z_{g3}}.$$

The relative tooth aligning position of each planetary gear set on the ring gear is as follows.

A relative tooth aligning position of the first planetary gear set is the 0° line position of the ring gear.

A relative tooth aligning position of the second planetary gear set is a line position $$\frac{360°(2-1)}{3}$$

of the ring gear, that is, a 120° line position of the ring gear.

A relative tooth aligning position of the third planetary gear set is a line position $$\frac{360°(3-1)}{3}$$

of the ring gear, that is, a 240° line position of the ring gear.

When all tooth difference angle position and relative tooth aligning positions are calculated, the tooth valley center of the planetary gear of each linkage in each planetary gear set closest to the baseline position may be found according to the tooth difference angle position, then gear tooth processing is carried out on the planetary gear of each linkage in the planetary gear set, and then the planetary gear of each linkage is coaxially connected into the planetary gear set, so that each planetary gear set may be subjected to tooth alignment assembly with the tooth aligning mechanism on the planetary carrier H according to the baseline position and the relative tooth aligning position.

In the design method, because the planetary gear of each linkage in the rest planetary gear sets, except the first planetary gear set, is regarded as sequentially moving to the line position $$\frac{360°(m-1)}{M}$$

of the corresponding ring gear from the planetary gear of each linkage in the first planetary gear set, when each planetary gear set is subjected to tooth alignment assembly, the tooth alignment assembly must be carried out according to the set sequence of each planetary gear set, especially for the multi-linkage planetary gear speed changing mechanism with the number of planetary gear sets M greater than 2, once the set sequence is wrong in mounting, tooth alignment cannot be continued. When each planetary gear set is subjected to tooth alignment assembly on the planetary carrier H according to the corresponding set sequence, because the baseline position of the finally, processed and assembled planetary gear set has been determined, and the tooth aligning position with the ring gear on the planetary gear of each linkage also directly corresponds to the baseline position, the tooth alignment assembly of all planetary gear sets may be directly completed only by successful tooth alignment of a planetary gear of a certain linkage according to the baseline position, while planetary gears of the rest linkages may realize tooth alignment with the ring gear to operate without tooth alignment adjustment, so that the tooth alignment assembly of the planetary gear sets is more direct and rapid through positioning and assembly. As long as a mounting sequence and tooth alignment are accurate, the planetary gear of each linkage in each planetary gear set may change synchronously during operation of the multi-linkage planetary gear speed changing mechanism, so that the finally, manufactured and assembled multi-linkage planetary gear speed changing mechanism may break through the limitation of assembly condition, and an application of the multi-linkage planetary gear speed changing mechanism may be expanded.

Second Embodiment

In First Embodiment, the ring gear is taken as the tooth aligning mechanism to design and calculate according to the tooth alignment of the planetary gear set with the ring gear, while in this embodiment, the sun gear is taken as the tooth aligning mechanism to design and calculate according to the tooth alignment of the planetary gear set with the sun gear, and a design principle in this embodiment is the same as that in First Embodiment.

Specifically, a calculation formula of the tooth difference angle position of the planetary gear of each linkage in each planetary gear set relative to the baseline position is $$360° - \left[ \frac{\frac{360°(m-1)}{M}}{\frac{360°}{Z_{ax}}} - \text{integer number of teeth} \right] \frac{360°}{Z_{gn}},$$

where M is a number of planetary gear sets, m is a set sequence of each planetary gear set arranged counterclockwise, m=1, 2, 3 . . . M, $Z_{gn}$ is a number of teeth of the planetary gear of each linkage in the multi-linkage planetary gear speed changing mechanism, $Z_{ax}$ is a number of teeth of the sun gear in the same linkage with the planetary gear, the integer number of teeth is an integer in $$\frac{\frac{360°(m-1)}{M}}{\frac{360°}{Z_{ax}}},$$

and $$\left[ \frac{\frac{360°(m-1)}{M}}{\frac{360°}{Z_{ax}}} - \text{integer number of teeth} \right] \frac{360°}{Z_{gn}}$$

is a tooth difference angle of the planetary gear of each linkage in each planetary gear set relative to the baseline position.

Figure 4:
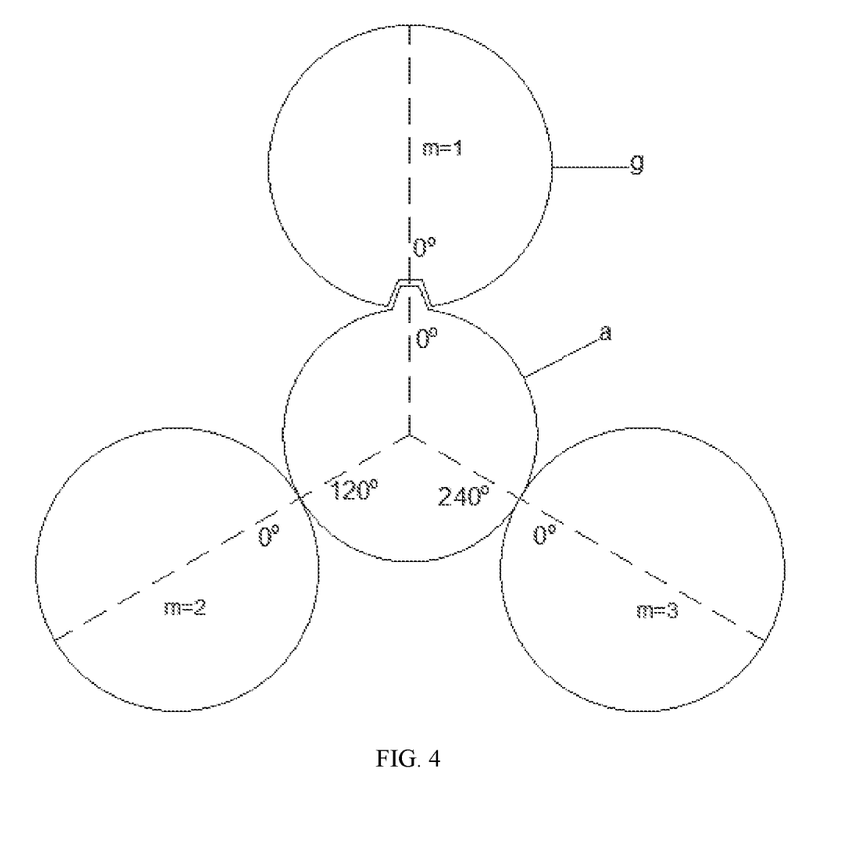
FIG. 4 is a schematic diagram of a corresponding relationship between each planetary gear set and a sun gear in the case of tooth alignment with the sun gear in the present invention.

Preferably, for the convenience of calculation and understanding, as shown in FIG. 4, taking a case that the number of planetary gear sets is 3 and each planetary gear set is composed of 3 coaxially connected planetary gears as an example as well, the tooth difference angle position of the planetary gear of each linkage in each planetary gear set relative to the baseline position is as follows.

A tooth difference angle position of a planetary gear of each linkage in a first planetary gear set is respectively the 0° line position.

A tooth difference angle position of a planetary gear of a first linkage in a second planetary gear set is a line position $$360° - \left[ \frac{\frac{360°(2-1)}{3}}{\frac{360°}{Z_{a1}}} - \text{integer number of teeth} \right] \frac{360°}{Z_{g1}}.$$

A tooth difference angle position of a planetary gear of a second linkage in the second planetary gear set is a line position $$360° - \left[ \frac{\frac{360°(2-1)}{3}}{\frac{360°}{Z_{a2}}} - \text{integer number of teeth} \right] \frac{360°}{Z_{g2}}.$$

A tooth difference angle position of a planetary gear of a third linkage in the second planetary gear set is a line position $$360° - \left[ \frac{\frac{360°(2-1)}{3}}{\frac{360°}{Z_{a3}}} - \text{integer number of teeth} \right] \frac{360°}{Z_{g3}}.$$

A tooth difference angle position of a planetary gear of a first linkage in a third planetary gear set is a line position $$360° - \left[ \frac{\frac{360°(3-1)}{3}}{\frac{360°}{z_{a1}}} - \text{integer number of teeth} \right] \frac{360°}{Z_{g1}}.$$

A tooth difference angle position of a planetary gear of a second linkage in the third planetary gear set is a line position $$360° - \left[ \frac{\frac{360°(3-1)}{3}}{\frac{360°}{z_{a2}}} - \text{integer number of teeth} \right] \frac{360°}{Z_{g2}}.$$

A tooth difference angle position of a planetary gear of a third linkage in the third path planetary gear set is a line position $$360° - \left[ \frac{\frac{360°(3-1)}{3}}{\frac{360°}{z_{a3}}} - \text{integer number of teeth} \right] \frac{360°}{Z_{g3}}.$$

The relative tooth aligning position of each planetary gear set on the sun gear is as follows.

A relative tooth aligning position of the first planetary gear set is the 0° line position of the sun gear.

A relative tooth aligning position of the second planetary gear set is a line position $$\frac{360°(2-1)}{3}$$

of the sun gear, that is, a 120° line position of the sun gear.

A relative tooth aligning position of the third planetary gear set is a line position $$\frac{360°(3-1)}{3}$$

of the sun gear, that is, a 240° line position of the sun gear.

Because rotation directions of the sun gear and the ring gear are opposite, as shown in FIG. 4, the relative tooth aligning position of each planetary gear set is recalculated by setting the set sequence counterclockwise.

Third Embodiment

According to the design methods and principles in First Embodiment and Second Embodiment, this embodiment provides a manufacturing method of a multi-linkage planetary gear speed changing mechanism, which includes the following steps of:

1. processing and assembling each planetary gear set according to a baseline position and a tooth difference angle position; and
2. sequentially subjecting each planetary gear set to tooth alignment assembly with a tooth aligning mechanism on a planetary carrier according to a set sequence.

When each planetary gear set is processed and assembled, after the baseline position of the planetary gear set is determined, the tooth difference angle position of the planetary gear of each linkage is determined according to the baseline position, which means that a tooth valley center closest to the baseline position is found, and finally, the planetary gear set is processed and assembled by taking the found tooth valley center as a gear tooth processing starting position of the planetary gear of each linkage. Specifically, during processing, the found tooth valley center may be taken as the gear tooth processing starting position of the planetary gear of each linkage to integrally mold and process the planetary gear set, so that it is not necessary to assemble the planetary gear of each linkage into the set; and the found tooth valley center may also be taken as the gear tooth processing starting position of the planetary gear of each linkage to respectively process the planetary gear of each linkage, and then the planetary gear of each linkage is assembled into the set based on the baseline position.

Fourth Embodiment

According to the foregoing description, because there is the tooth difference angle between the tooth valley center of the planetary gear of each linkage in each planetary gear set clockwise closest to the baseline position and the baseline position, the tooth valley center closest to the baseline position may be found according to the baseline position in Third Embodiment, and the baseline position may also be found according to the tooth valley center closest to the baseline position by an inverse method, so that this embodiment provides another method for processing and assembling each planetary gear set. That is to say, the planetary gear of each linkage in the planetary gear set is respectively processed and molded first, in the case that the baseline position is not determined, one tooth valley center of the planetary gear of each linkage is set as a point closest to the baseline position first, then the baseline position of the planetary gear of each linkage is obtained by the inverse method according to the tooth difference angle of the planetary gear of each linkage, and finally, the planetary gear of each linkage in each planetary gear set is assembled into the set according to the determined baseline position.

Fifth Embodiment

It can be seen from the calculation of the tooth difference angle position in the formula $$360° - \left[ \frac{\frac{360°(m-1)}{M}}{\frac{360°}{z_{by}}} - \text{integer number of teeth} \right] \frac{360°}{Z_{gn}}$$

in First Embodiment and in the formula $$360° - \left[ \frac{\frac{360°(m-1)}{M}}{\frac{360°}{z_{ax}}} - \text{integer number of teeth} \right] \frac{360°}{Z_{gn}}$$

in Second Embodiment that $z_{ax}$ does not participate in calculation of the calculation formula in tooth alignment with the ring gear, and $Z_{by}$ does not participate in calculation of the calculation formula in tooth alignment with the sun gear, so that for a design of the multi-linkage planetary gear speed changing mechanism in which only one of the ring gear and the sun gear needs to participate in transmission, it is only necessary to consider the meshing between the ring gear or the sun gear and the planetary gear, and each planetary gear set does not interfere with each other, without needing to design according to the assembly condition of the NGW planetary gear mechanism; and for a design of the multi-linkage planetary gear speed changing mechanism in which the ring gear and the sun gear both participate in transmission, a number of teeth of the planetary gear $z_{gn}$, a number of teeth of the ring gear $z_{by}$ and a number of teeth of the sun gear $z_{ax}$ in a planetary gear unit of the same linkage should all be designed according to design requirements of the NGW planetary gear mechanism. For the multi-linkage planetary gear speed changing mechanism designed according to the design requirements of the NGW planetary gear mechanism, the tooth difference angle of the planetary gear may be calculated according to the tooth alignment with the ring gear, or the tooth difference angle of the planetary gear may be calculated according to the tooth alignment with the sun gear.

Therefore, during specific manufacturing of the multi-linkage planetary gear speed changing mechanism, the number of linkages and the ring gear of each linkage or the sun gear of each linkage may be selected according to different transmission requirements, so that in combination with the design method and the manufacturing method above, this embodiment further provides a gear speed changing mechanism, which is specifically a multi-linkage planetary gear speed changing mechanism, where there may only be the ring gear without the sun gear, or there may only be the sun gear without the ring gear, or there may be both of the sun gear and the ring gear in each linkage to participate in transmission.

Figure 5:
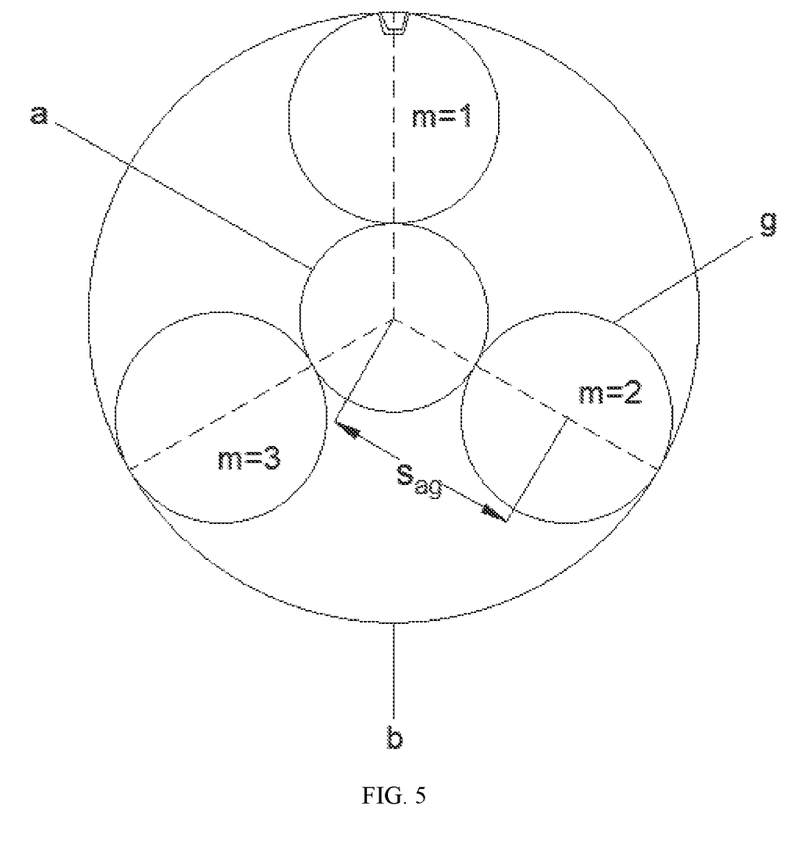
FIG. 5 is a diagram showing an adjacency relationship of an NGW planetary gear mechanism.

According to the analysis of helical gear reference $$\text{circle} = \frac{mz}{\cos\beta}$$

and spur gear reference circle=mz (m represents a gear module herein), as long as all planetary gears, ring gears and sun gears in the multi-linkage planetary gear speed changing mechanism have the same module and the same inclination angle of tooth, a spur gear and a helical gear have the same design method. For the multi-linkage planetary gear mechanism needing both of the ring gear and the sun gear to participate in transmission, it can be seen from a diagram showing an adjacency relationship of the NGW planetary gear mechanism in FIG. 5 that $s_{ag}$ is a distance from a center of the sun gear to a center of the planetary gear in the NGW planetary gear mechanism, which is a half of the number of teeth of the sun gear multiplied by the modulus plus a half of the number of teeth of the planetary gear multiplied by the modulus. For the spur gear, that is, $$s_{ag} = \frac{z_{ax}m}{2} + \frac{z_{gn}m}{2},$$

because the numbers of teeth of the gears are all integer numbers of tooth, $$\frac{2Sag}{m} = \frac{z_{ax}m + z_{gn}m}{m} = Zax + Zgn = \text{integer number of teeth}$$

is further obtained, which shows that in the multi-linkage planetary gear speed changing mechanism, because $2s_{ag}$ of each linkage is divisible by the corresponding modulus value m, when $2s_{ag}$ of each linkage is divisible by modulus values of the spur gears with the same modulus, the planetary gears of different linkages in the planetary gear set can be designed by using the spur gears with the same modulus; and when $2s_{ag}$ of each linkage is divisible by module values of the spur gears with different modules, the planetary gears of different linkages in the planetary gear set can be designed by using the spur gears with different modules. Because the modulus of the helical gear is equal to the modulus of the spur gear divided by the inclination angle of tooth $\cos\beta$, for the helical gear, $$\frac{2Sag}{\frac{m}{\cos\beta}} = \frac{z_{ax}\frac{m}{\cos\beta} + z_{gn}\frac{m}{\cos\beta}}{\frac{m}{\cos\beta}} = Zax + Zgn = \text{integer number of teeth},$$

is obtained in the same may, that is, when $2s_{ag}$ of each linkage is divisible by modulus values of the helical gears with the same modulus, the planetary gears of different linkages in the planetary gear set can be designed by using the helical gears with the same modulus; and when $2s_{ag}$ of each linkage is divisible by module values of the helical gears with different modules, the planetary gears of different linkages in the planetary gear set can be designed by using the helical gears with different modules. In the same multi-linkage planetary gear speed changing mechanism, when the planetary gears of different linkages in the planetary gear set are designed as the spur gears with different modules or the same modulus, if $$\frac{2s_{ag}}{m} \ne \text{integer number of teeth,}$$

addendum modification may be used to meet conditions; and when the planetary gears of different linkages in the planetary gear set are designed as the helical gears with different modulus or the same modulus, if $$\frac{2s_{ag}}{\frac{m}{\cos\beta}} \ne \text{integer number of teeth,}$$

the inclination angle of tooth may be adjusted to meet conditions, or the addendum modification may also be used to meet conditions. For the multi-linkage planetary gear mechanism needing only one of the ring gear or the sun gear to participate in transmission, there are no restrictions above.

Therefore, for the multi-linkage planetary gear speed changing mechanism manufactured by the design method and the manufacturing method of the present invention according to different transmission requirements, the ring gear and the sun gear in each linkage may be selected to form different transmission combinations, and then different input, output and fixation relationships may be used, so that each transmission combination may obtain a corresponding transmission ratio in the same direction or in the opposite direction. Calculation formulas for transmission ratios of different combinations are as follows.

1. Linkage with Sun Gear and Ring Gear Participating in Transmission

I. The sun gears are respectively used for input, the ring gears are respectively fixed, and the planetary carrier is used for output in the same direction, and there are at most Y·X sets of output speed ratios.

When the sun gear of the same linkage is used for power input, the ring gear of the same linkage is fixed, and the planetary carrier is used for power output, a speed ratio of the same linkage in the multi-linkage planetary gear speed changing mechanism is $$i_{axH}^{by} = 1 + \frac{z_{by}}{z_{ax}}(x = y),$$

and there are at most N sets of the speed ratios.

When the sun gears of different linkages are respectively used for power input, the ring gears of different linkages are respectively fixed, and the planetary carrier is used for power output, a speed ratio of different linkages in the multi-linkage planetary gear speed changing mechanism is $i_{axH}^{by}=1+Z_{ax}^{gn} \cdot Z_{gn'}^{by}$, ($x \neq y$), and there are at most Y·X–N sets of the speed ratios, where $Z_{ax}^{gn}$ is a gear ratio of the planetary gear to the sun gear in the same linkage, that is, $$Z_{ax}^{gn} = \frac{z_{gn}}{z_{ax}}(n = x);$$

and $Z_{gn'}^{by}$ is a gear ratio of the ring gear to the planetary gear in the same linkage, that is, $$Z_{gn'}^{by} = \frac{z_{by}}{z_{gn'}}(n' = y),$$

and finally, $$i_{axH}^{by} = 1 + \frac{z_{gx}}{z_{ax}} \cdot \frac{z_{by}}{z_{gy}}$$

is obtained.

Conversely, when the planetary carrier is used for power input, the ring gears are respectively fixed, and the sun gears are respectively used for power output, a speed ratio $i_{Hax}^{by}$ is a reciprocal value of the speed ratio $i_{axH}^{by}$, that is, $$i_{Hax}^{by} = \frac{1}{i_{axH}^{by}},$$

and there are at most Y·X sets of the speed ratios.

II. The planetary carrier is fixed, the sun gears are respectively used for power input, and the ring gears are respectively used for output in the opposite direction, and there are at most Y·X sets of speed ratios.

When the sun gear of the same linkage is used for input and the ring gear of the same linkage is used for output, a speed ratio is $$-i_{axby}^{H} = \frac{z_{by}}{z_{ax}}(x = y),$$

and there are at most N sets of the speed ratios, where "−" represents that input steering and output steering are opposite (the same below).

When the sun gears of different linkages are respectively used for input and the ring gears of different linkages are respectively used for output, a speed ratio is $-i_{axby}^{H}=Z_{ax}^{gn} \cdot Z_{gn'}^{by}$ ($x \neq y$), and there are at most Y·X–N sets of the speed ratios, where $Z_{ax}^{gn}$ is a gear ratio of the planetary gear to the sun gear in the same linkage, that is, $$Z_{ax}^{gn} = \frac{z_{gn}}{z_{ax}}(n = x);$$

and $Z_{gn'}^{by}$ is a gear ratio of the ring gear to the planetary gear in the same linkage, that is, $$Z_{gn'}^{by} = \frac{z_{by}}{z_{gn'}}(n' = y),$$

and finally, $$-i_{axby}^{H} = \frac{z_{gx}}{z_{ax}} \cdot \frac{z_{by}}{z_{gy}}$$

is obtained.

Conversely, when the ring gears are respectively used for input and the sun gears are respectively used for output, a speed ratio $-i_{byax}^{H}$ is a reciprocal value of the speed ratio $-i_{axby}^{H}$, that is, $$-i_{byax}^{H} = -\frac{1}{-i_{axby}^{H}},$$

and there are at most Y·X sets of the speed ratios.

III. The sun gears are respectively fixed, the ring gears are respectively used for input, and the planetary carrier is used for output in the same direction, and there are at most Y·X sets of speed ratios.

When the ring gear of the same linkage is used for input and the planetary carrier is used for output, a speed ratio is $$i_{byH}^{ax} = 1 - \frac{z_{ax}}{z_{by}}(x = y),$$

and there are at most N sets of the speed ratios.

When the sun gears of different linkages are respectively fixed, the ring gears of different linkages are respectively used for input, and the planetary carrier is used for output, a speed ratio is $i_{byH}^{ax}=1-Z_{gn}^{ax} \cdot Z_{by}^{gn}$ ($x \neq y$), and there are at most Y·X–N sets of the speed ratios, where $Z_{gn}^{ax}$ is a gear ratio of the sun gear to the planetary gear in the same linkage, that is, $$Z_{gn}^{ax} = \frac{z_{gn}}{z_{by}}(n = y);$$

and $Z_{by}^{gn'}$ is a gear ratio of the planetary gear to the ring gear in the same linkage, that is, $$Z_{by}^{gn'} = \frac{z_{gn'}}{z_{by}}(n' = y),$$

and finally, $$i_{byH}^{ax} = 1 - \frac{z_{ax}}{z_{gx}} \cdot \frac{z_{gy}}{z_{by}}$$

is obtained.

Conversely, when the planetary carrier is used for input, the sun gears are respectively fixed, and the ring gears are respectively used for output, a speed ratio $i_{Hby}^{ax}$ is a reciprocal value of the speed ratio $i_{byH}^{ax}$, that is, $$i_{Hby}^{ax} = \frac{1}{i_{byH}^{ax}},$$

and there are at most Y·X sets of the speed ratios.

IV. The ring gears with different numbers of teeth of various linkages are respectively fixed and used for power input and the sun gears of various linkages are respectively used for output, and there are at most $(Y^2-Y)X$ sets of output speed ratios.

When the ring gears with less numbers of teeth are respectively fixed, the ring gears with more numbers of teeth are respectively used for power input, and the sun gears are respectively used for output in the opposite direction, a speed ratio is $$-i_{byax}^{by'} = \frac{1}{\frac{z_{by'}^{gn'} \cdot z_{gn}^{by} - 1}{z_{ax}^{gn''} \cdot z_{gn}^{by} + 1}} - 1 (y' > y),$$

and there are at most $(Y^2-Y)X/2$ sets of the speed ratios. $Z_{by}^{gn'}$ is a gear ratio of the planetary gear to the ring gear in the same linkage, that is, $$Z_{by'}^{gn'} = \frac{z_{gn'}}{z_{by'}}(n'= y');$$

$Z_{ax}^{gn''}$ is a gear ratio of the planetary gear to the sun gear in the same linkage, that is, $$Z_{ax}^{gn''} = \frac{z_{gn''}}{z_{ax}}(n'' = x);$$

and $Z_{gn}^{by}$ is a gear ratio of the ring gear to the planetary gear in the same linkage, that is, $$Z_{gn}^{by} = \frac{z_{by}}{z_{gn}}(n = y),$$

and finally, $$-i_{byax}^{by'} = \frac{1}{\frac{z_{gy'}}{z_{by'}} \cdot \frac{z_{by}}{z_{gy}} - 1}{\frac{z_{gx}}{z_{ax}} \cdot \frac{z_{by}}{z_{gy}} + 1} - 1$$

is obtained.

When the ring gears with more numbers of teeth are respectively fixed, the ring gears with less numbers of teeth are respectively used for power input, and the sun gears are respectively used for output in the same direction, a speed ratio is $$i_{by'ax}^{by} = \frac{1}{\frac{z_{by}^{gn'} \cdot z_{gn}^{by'} - 1}{z_{ax}^{gn''} \cdot z_{gn}^{by'} + 1}} + 1,$$

and there are at most $(Y^2-Y)X/2$ sets of the speed ratios. $Z_{by}^{gn'}$ is a gear ratio of the planetary gear to the ring gear in the same linkage, that is, $$Z_{by}^{gn'} = \frac{z_{gn'}}{z_{by}}(n' = y);$$

$Z_{ax}^{gn''}$ is a gear ratio of the planetary gear to the sun gear in the same linkage, that is, $$Z_{ax}^{gn''} = \frac{z_{gn''}}{z_{ax}}(n'' = x);$$

and $Z_{gn}^{by'}$ is a gear ratio of the ring gear to the planetary gear in the same linkage, that is, $$Z_{gn}^{by'} = \frac{z_{by'}}{z_{gn}}(n = y'),$$

and finally, $$i_{by'ax}^{by} = \frac{1}{\frac{z_{gy}}{z_{by}} \cdot \frac{z_{by'}}{z_{gy'}} - 1}{\frac{z_{gx}}{z_{ax}} \cdot \frac{z_{by'}}{z_{gy'}} + 1} + 1$$

is obtained.

V. The sun gears are respectively used for power input and the ring gears with different numbers of teeth are respectively fixed and used for power output, and there are at most $(Y^2-Y)X$ sets of output speed ratios.

When the ring gears with less numbers of teeth are respectively fixed, the sun gears are respectively used for power input, and the ring gears with more numbers of teeth are respectively used for power output in the opposite direction, a speed ratio is $$i_{axby}^{by'} = \frac{z_{ax}^{gn'} \cdot z_{gn}^{by} + 1}{z_{by'}^{gn''} \cdot z_{gn}^{by} - 1} - 1 (y' > y),$$

and there are at most $(Y^2-Y)X/2$ sets of the speed ratios. $Z_{ax}^{gn'}$ is a gear ratio of the planetary gear to the sun gear in the same linkage, that is, $$Z_{ax}^{gn'} = \frac{z_{gn'}}{z_{ax}} (n' = x);$$

$Z_{by'}^{gn''}$ is a gear ratio of the planetary gear to the ring gear by in the same linkage, that is, $$Z_{by'}^{gn''} = \frac{z_{gn''}}{z_{by'}} (n'' = y');$$

and $Z_{gn}^{by}$ is a gear ratio of the ring gear to the planetary gear in the same linkage, that is, $$Z_{gn}^{by} = \frac{z_{by}}{z_{gn}} (n = y) - i_{axby}^{by'},$$

and finally, $$-i_{axby}^{by'} = \frac{\frac{z_{gx}}{z_{ax}} \cdot \frac{z_{by}}{z_{gy}} + 1}{\frac{z_{gy'}}{z_{by'}} \cdot \frac{z_{by}}{z_{gy}} - 1} - 1$$

is obtained.

When the ring gears with more numbers of teeth are respectively fixed, the sun gears are respectively used for power input, and the ring gears with less numbers of teeth are respectively used for output in the same direction, a speed ratio is $$i_{axby'}^{by} = \frac{z_{ax}^{gn'} \cdot z_{gn}^{by'} + 1}{z_{by}^{gn''} \cdot z_{gn}^{by'} - 1} + 1,$$

and there are at most $(Y^2-Y)X/2$ sets of the speed ratios. $Z_{ax}^{gn'}$ is a gear ratio of the planetary gear to the sun gear in the same linkage, that is, $$Z_{ax}^{gn'} = \frac{z_{gn'}}{z_{ax}} (n' = x);$$

$Z_{by}^{gn''}$ is a gear ratio of the planetary gear to the ring gear in the same linkage, that is, $$Z_{by}^{gn''} = \frac{z_{gn''}}{z_{by}} (n'' = y);$$

and $Z_{gn}^{by'}$ is a gear ratio of the ring gear to the planetary gear in the same linkage, that is, $$Z_{gn}^{by'} = \frac{z_{by'}}{z_{gn}} (n = y'),$$

and finally, $$i_{axby'}^{by} = \frac{\frac{z_{gx}}{z_{ax}} \cdot \frac{z_{by'}}{z_{gy'}} + 1}{\frac{z_{gy}}{z_{by}} \cdot \frac{z_{by'}}{z_{gy'}} - 1} + 1$$

is obtained.

VI. The sun gears are respectively fixed, the ring gears are respectively used for power input, and the sun gears are respectively used for power output, and there are at most $(X^2-X)Y$ sets of output speed ratios.

When the sun gears with less numbers of teeth are respectively fixed, the ring gears are respectively used for power input, and the sun gears with more numbers of teeth are respectively used for power output in the same direction, a speed ratio is $$i_{byax'}^{ax} = \frac{z_{by}^{gn'} \cdot z_{gn}^{ax'} + 1}{z_{ax}^{gn''} \cdot z_{gn}^{ax'} - 1} + 1 (x' < x),$$

and there are at most $(Y^2-Y)X/2$ sets of the speed ratios. $Z_{by}^{gn'}$ is a gear ratio of the planetary gear to the ring gear in the same linkage, that is, $$Z_{by}^{gn'} = \frac{z_{gn'}}{z_{by}} (n' = y);$$

$Z_{ax}^{gn''}$ is a gear ratio of the planetary gear to the sun gear in the same linkage, that is, $$Z_{ax}^{gn''} = \frac{z_{gn''}}{z_{ax}} (n'' = x);$$

and $Z_{gn}^{ax'}$ is a gear ratio of the sun gear to the planetary gear in the same linkage, that is, $$Z_{gn}^{ax'} = \frac{z_{ax'}}{z_{gn}} (n = x'),$$

and finally, $$i_{byax'}^{ax} = \frac{\frac{z_{gy}}{z_{by}} \cdot \frac{z_{ax'}}{z_{g_{x'}}} + 1}{\frac{z_{gx}}{z_{ax}} \cdot \frac{z_{ax'}}{z_{g_{x'}}} - 1} + 1$$

is obtained.

When the sun gears with more numbers of teeth are respectively fixed, the ring gears are respectively used for power input, and the sun gears with less numbers of teeth are respectively used for power output in the opposite direction, a speed ratio is $$-i_{byax}^{ax'} = \frac{Z_{by}^{gn'} \cdot Z_{gn}^{ax'} + 1}{Z_{ax}^{gn''} \cdot Z_{gn}^{ax'} - 1} - 1,$$

and there are at most $(X^2-X)Y/2$ sets of the speed ratios. $Z_{by}^{gn'}$ is a gear ratio of the planetary gear to the ring gear in the same linkage, that is, $$Z_{by}^{gn'} = \frac{z_{gn'}}{z_{by}} (n' = y);$$

$Z_{ax}^{gn''}$ is a gear ratio of the planetary gear to the sun gear in the same linkage, that is, $$Z_{ax}^{gn''} = \frac{z_{gn''}}{z_{ax}} (n'' = x);$$

and $Z_{gn}^{ax'}$ is a gear ratio of the sun gear to the planetary gear in the same linkage, that is, $$z_{gn}^{ax'} = \frac{z_{ax'}}{z_{gn}} (n = x'),$$

and finally, $$-i_{byax}^{ax'} = \frac{\frac{z_{gy}}{z_{by}} \cdot \frac{z_{ax'}}{z_{g_{x'}}} + 1}{\frac{z_{gx}}{z_{ax}} \cdot \frac{z_{ax'}}{z_{g_{x'}}} - 1} - 1$$

is obtained.

When the sun gears with less numbers of teeth are respectively fixed, the sun gears with more numbers of teeth are respectively used for power input, and the ring gears are respectively used for output in the same direction, a speed ratio $i_{ax'by}^{ax}$ is a reciprocal value of the speed ratio $i_{byax}^{ax'}$, that is, the speed ratio is $$i_{ax'by}^{ax} = \frac{1}{i_{byax}^{ax'}},$$

and there are at most $(X^2-X)Y/2$ sets of the speed ratios; when the sun gears with more numbers of teeth are respectively fixed, the sun gears with less numbers of teeth are respectively used for power input, and the ring gears are respectively used for output in the opposite direction, a speed ratio $-i_{axby}^{ax'}$ is a reciprocal value of the speed ratio $-i_{byax}^{ax'}$, that is, the speed ratio is $$-i_{axby}^{ax'} = \frac{1}{-i_{byax}^{ax'}},$$

and there are at most $(X^2-X)Y/2$ sets of the speed ratios.

2. Linkage with Only Sun Gear Participating in Transmission

I. The sun gears with different numbers of teeth of various linkages are respectively fixed and respectively used for power input and the planetary carrier is used for output, and there are at most $X^2-X$ sets of speed ratios.

When the sun gears with less numbers of teeth are respectively fixed, the sun gears with more numbers of teeth are respectively used for power input, and the planetary carrier is used for power output in the opposite direction, a speed ratio is $-i_{axH}^{ax'} = Z_{gn'}^{ax'} \cdot Z_{ax}^{gn} - 1$ ($x' < x$), and there are at most $X^2-X/2$ sets of the speed ratios. $Z_{gn'}^{ax'}$ is a gear ratio of the sun gear to the planetary gear in the same linkage, that is, $$Z_{gn'}^{ax'} = \frac{z_{ax'}}{z_{gn'}} (n' = x');$$

and $Z_{ax}^{gn}$ is a gear ratio of the planetary gear to the sun gear in the same linkage, that is, $$Z_{ax}^{gn} = \frac{z_{gn}}{z_{ax}} (n = x),$$

and finally, $$-i_{axH}^{ax'} = \frac{-z_{ax'}}{z_{gx'}} \cdot \frac{z_{gx}}{z_{ax}} - 1$$

is obtained.

When the sun gears with more numbers of teeth are respectively fixed, the sun gears with less numbers of teeth are respectively used for power input, and the planetary carrier is used for output in the same direction, a speed ratio is $i_{ax'H}^{ax} = 1 - Z_{gn}^{ax} \cdot Z_{ax}^{gn'}$, and there are at most $X^2-X/2$ sets of the speed ratios, where $Z_{gn}^{ax}$ is a gear ratio of the sun gear to the planetary gear in the same linkage, that is, $$Z_{gn}^{ax} = \frac{z_{ax}}{z_{gn}} (n = x)$$

and $Z_{ax}^{gn'}$ is a gear ratio of the planetary gear to the sun gear in the same linkage, that is, $$z_{ax'}^{gn'} = \frac{z_{gn'}}{z_{ax'}} (n' = x'),$$

and finally, $$i_{ax'H}^{ax} = 1 - \frac{z_{ax}}{z_{gx}} \cdot \frac{z_{gx'}}{z_{ax'}}$$

is obtained.

When the planetary carrier is used for input, the sun gears with different numbers of teeth of various linkages are respectively fixed and used for power output in the opposite direction, a speed ratio $-i_{Hax}^{ax'}$ is a reciprocal value of the speed ratio $-i_{axH}^{ax'}$, that is, $$-i_{Hax}^{ax'} = \frac{1}{-i_{axH}^{ax'}},$$

and there are at most it $X^2-X/2$ sets of the speed ratios; and when the planetary carrier is used for input, and the sun gears with different numbers of teeth of various linkages are respectively fixed and used for power output in the same direction, a speed ratio $i_{Hax'}^{ax}$ is a reciprocal value of the speed ratio $i_{ax'H}^{ax}$, that is, $$i_{Hax'}^{ax} = \frac{1}{i_{ax'H}^{ax}},$$

and where are at most $X^2-X$ sets of the speed ratios.

II. The ring gears with different numbers of teeth of various linkages are respectively fixed and used for output and the planetary carrier is used for power input, and there are at most $Y^2-Y$ sets of speed ratios.

When the ring gears with less numbers of teeth are respectively fixed, the planetary carrier is used for power input, and the ring gears with more numbers of teeth are respectively used for power output in the opposite direction, a speed ratio is $$-i_{Hby}^{by'} = \frac{1}{Z_{by}^{gn} \cdot Z_{gn'-1}^{by'}} (y' > y),$$

and there are at most $Y^2-Y/2$ sets of the speed ratios. $Z_{by}^{gn}$ is a gear ratio of the planetary gear to the ring gear in the same linkage, that is, $$Z_{by}^{gn} = \frac{z_{gn}}{z_{by}} (n = y);$$

and $Z_{gn'}^{by'}$ is a gear ratio of the ring gear to the planetary gear in the same linkage, that is, $$Z_{gn'}^{by'} = \frac{z_{by'}}{z_{gn'}} (n' = y'),$$

and finally, $$-i_{Hby'}^{by'} = \frac{1}{\frac{z_{gy}}{z_{by}} \cdot \frac{z_{by'}}{z_{gy'}} - 1}$$

is obtained.

When the ring gears with more numbers of teeth are respectively fixed, the planetary gear is used for power input, and the ring gears with less numbers of teeth are respectively used for power output in the same direction, a speed ratio is $$i_{Hby'}^{by} = \frac{1}{1 - Z_{by}^{gn} \cdot Z_{gn'}^{by'}},$$

and there are at most $Y^2-Y/2$ sets of the speed ratios. $Z_{by}^{gn}$ is a gear ratio of the planetary gear to the ring gear in the same linkage, that is, $$Z_{by}^{gn} = \frac{z_{gn}}{z_{by}} (n = y);$$

and $Z_{gn'}^{by'}$ is a gear ratio of the ring gear to the planetary gear in the same linkage, that is, $$Z_{gn'}^{by'} = \frac{z_{by'}}{z_{gn'}} (n' = y'),$$

and finally, $$i_{Hby'}^{by} = \frac{1}{1 - \frac{z_{gy}}{z_{by}} \cdot \frac{z_{by'}}{z_{gy'}}}$$

is obtained.

When the ring gears with less numbers of teeth are respectively fixed, the ring gears with more numbers of teeth are respectively used for power input, and the planetary carrier is used for output in the opposite direction, a speed ratio $-i_{byH}^{by'}$ is a reciprocal value of the speed ratio $-i_{iHby}^{by'}$, that is, $$-i_{byH}^{by'} = \frac{1}{-i_{Hby}^{by'}},$$

and there are at most $N^2-N/2$ sets of the speed ratios; and when the ring gears with more numbers of teeth are respectively fixed, the planetary carrier is used for input, and the ring gears with less numbers of teeth are respectively used for power output in the same direction, a speed ratio $i_{Hby'}^{by}$ is a reciprocal value of the speed ratio $i_{by'H}^{by}$, that is, $$i_{byH'}^{by} = \frac{1}{i_{by'H}^{by}},$$

and there are at most $Y^2-Y$ sets of the speed ratios.

To sum up, the multi-linkage planetary gear speed changing mechanism manufactured by the design method and the manufacturing method in the present invention has a wide range of speed ratio combinations, thus being more convenient in a design with a large speed ratio or a design with many gears and a linear change of gear ratio, such as a speed change of an automobile, and reducing a manufacturing cost and a maintenance difficulty at the same time.

Finally, it should be noted that the above embodiments describe the design principle of the multi-linkage planetary gear speed changing mechanism in the present invention, and in practical application, the numbers of linkages of the sun gear and the ring gear may be selected according to design requirements for speed ratios. Moreover, the above embodiments are only used to illustrate the design method of technology of the present invention and are not intended to limit the present invention. Although the present invention is described in detail with reference to the preferred embodiments, those of ordinary skills in the art should understand that modifications or equivalent replacements made on the technical solutions of the present invention without deviating from the spirit and scope of the technical solutions of the present invention should be included within the scope of the claims of the present invention.

What is claimed is:

1. A design method of a multi-linkage planetary gear speed changing mechanism, wherein a plurality of coaxial planetary gears form one set, a tooth aligning mechanism and a plurality of planetary gears on a same radial plane form one linkage, and the design method comprising the following steps of:

taking any planetary gear set as a first planetary gear set, and subjecting the planetary gear set to tooth alignment with the tooth aligning mechanism to determine a relative tooth aligning position of the first planetary gear set; and setting a baseline position of each planetary gear set as a 0° line position, and a tooth valley center of the planetary gear of each linkage in the first planetary gear are set corresponding to the baseline position;

determining the baseline position of each planetary gear set as a tooth aligning position of each planetary gear set, and calculating a tooth difference angle position of a planetary gear of each linkage in each planetary gear set relative to the baseline position; and taking the relative tooth aligning position of the first planetary gear set as a calculation starting position, and calculating a relative tooth aligning position of each planetary gear set.

2. The design method of the gear speed changing mechanism according to claim 1, wherein the tooth aligning mechanism is set as a ring gear, one tooth peak center of the ring gear is taken as a 0° line position of the ring gear, and the 0° line position of the ring gear is determined as the relative tooth aligning position of the first planetary gear set on the ring gear.

3. The design method of the multi-linkage planetary gear speed changing mechanism according to claim 2, wherein the multi-linkage planetary gear speed changing mechanism has a total of N linkages, the planetary gear of each linkage in each planetary gear set as gn, n is a linkage sequence of the planetary gear of each linkage, n=1, 2, 3 N, a ring gear of each linkage is by, y is a linkage sequence of the ring gear of each linkage, y=1, 2, 3 . . . N, the tooth difference angle position of the planetary gear of each linkage in each planetary gear set relative to the baseline position is calculated according to a calculation formula of:

where, M is a number of the planetary gear sets, m is a set sequence of each planetary gear set arranged clockwise, m=1, 2, 3 . . . M, is a number of teeth of the planetary gear of each linkage in the multi-linkage planetary gear speed changing mechanism, is a number of the teeth of the ring gear in the same linkage with the planetary gear, the integer number of teeth is an integer in, and is a tooth difference angle of the planetary gear of each linkage in each planetary gear set relative to the baseline position.

4. The design method of the gear speed changing mechanism according to claim 1, wherein the tooth aligning mechanism is set as a sun gear, one tooth peak center of the sun gear is taken as a 0° line position of the sun gear, and the 0° line position of the sun gear is determined as the relative tooth aligning position of the first planetary gear set on the sun gear during tooth alignment with the sun gear.

5. The design method of the multi-linkage planetary gear speed changing mechanism according to claim 4, wherein the multi-linkage planetary gear speed changing mechanism has a total of N linkages, the planetary gear of each linkage in each planetary gear set as gn, n is a linkage sequence of the planetary gear of each linkage, n=1, 2, 3 . . . N, a sun gear of each linkage is ax, x is a linkage sequence of the sun gear of each linkage, x=1, 2, 3 . . . N, the tooth difference angle position of the planetary gear of each linkage in each planetary gear set relative to the baseline position is calculated according to a calculation formula of:

where, M is a number of planetary gear sets, m is a set sequence of each planetary gear set arranged counter-clockwise, m=1, 2, 3 . . . M, is a number of teeth of the planetary gear of each linkage in the multi-linkage planetary gear speed changing mechanism, is a number of teeth of the sun gear in the same linkage with the planetary gear, the integer number of teeth is an integer in, and is a tooth difference angle of the planetary gear of each linkage in each planetary gear set relative to the baseline position.

6. A manufacturing method of a multi-linkage planetary gear speed changing mechanism, wherein the manufacturing method comprises the following steps of:

designing a multi-linkage planetary gear speed changing mechanism by the design method of the multi-linkage planetary gear speed changing mechanism according to claim 1, and processing and assembling each planetary gear set according to a baseline position and a tooth difference angle position; and sequentially subjecting each planetary gear set to tooth alignment assembly with a tooth aligning mechanism on a planetary carrier according to a set sequence.

7. The manufacturing method of the multi-linkage planetary gear speed changing mechanism according to claim 6, wherein when each planetary gear set is processed and assembled, the baseline position of the planetary gear set is determined first, then a tooth difference angle position of a planetary gear of each linkage is determined according to the baseline position, and finally, the planetary gear set is processed and assembled by taking the tooth difference angle position of the planetary gear of each linkage as a gear tooth processing starting position of the planetary gear of each linkage.

8. The manufacturing method of the multi-linkage planetary gear speed changing mechanism according to claim 6, wherein when each planetary gear set is processed and assembled, the planetary gear of each linkage in the planetary gear set is respectively processed and molded first, then a baseline position of the planetary gear of each linkage is determined according to the tooth difference angle position of the planetary gear of each linkage by taking one tooth valley center of the planetary gear of each linkage as a starting point, and the planetary gear of each linkage in the planetary gear set is assembled into the set according to the determined baseline position.

* * * * *